(12) United States Patent
Vimercati et al.

(10) Patent No.: US 7,272,059 B2
(45) Date of Patent: Sep. 18, 2007

(54) SENSING CIRCUIT FOR A SEMICONDUCTOR MEMORY

(75) Inventors: Daniele Vimercati, Carate Brianza (IT); Sara Fiorina, Nembro (IT); Efrem Bolandrina, Fiorano Al Serio (IT); Stefan Schippers, Peschiera Del Garda (IT); Marco Onorato, Concorezzo (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 27 days.

(21) Appl. No.: 10/913,128

(22) Filed: Aug. 6, 2004

(65) Prior Publication Data

US 2005/0030809 A1    Feb. 10, 2005

(30) Foreign Application Priority Data

Aug. 6, 2003    (EP) .................................. 03017939

(51) Int. Cl.
*G11C 7/00*    (2006.01)

(52) U.S. Cl. ..................... 365/203; 365/196; 365/207

(58) Field of Classification Search ................. 365/203
See application file for complete search history.

(56) References Cited

U.S. PATENT DOCUMENTS

| | | | |
|---|---|---|---|
| 5,432,746 | A | 7/1995 | Guedj |
| 5,469,382 | A | 11/1995 | Yero |
| 5,581,511 | A | 12/1996 | Gaultier et al. |

(Continued)

FOREIGN PATENT DOCUMENTS

| EP | 0399362 | 11/1990 |
|---|---|---|

(Continued)

OTHER PUBLICATIONS

Partial European Search Report, EP03017939, Jan. 21, 2004.

(Continued)

*Primary Examiner*—Thong Q. Le
(74) *Attorney, Agent, or Firm*—Graybeal Jackson Haley LLP

(57) ABSTRACT

A sensing circuit for a semiconductor memory comprising a circuit branch intended to be electrically coupled to a memory bit line having connected thereto a memory cell to be sensed. A bit line precharge circuit is provided, for precharging the memory bit line to a predetermined potential in a precharge phase of a memory cell sensing operation. An evaluation circuit is associated with the memory bit line for evaluating an electric quantity developing on the memory bit line during an evaluation phase of the memory cell sensing operation; the electric quantity that develops on the memory bit line is indicative of an information content of the memory cell. The bit line precharge circuit is adapted to both charging and discharging the memory bit line, so that the predetermined bit line potential is reached irrespective of a memory bit line initial potential at the beginning of the precharge phase. The bit line precharge circuit is adapted to both charging and discharging the memory bit line, depending on a difference between a memory bit line potential and the predetermined bit line potential. At least the precharge circuit includes a precharge negative feedback control loop, for controlling the memory bit line potential during the precharge phase. A same circuit element is provided that controls the memory bit line potential during the precharge phase and evaluates the electric quantity during the evaluation phase of the memory cell sensing operation.

30 Claims, 5 Drawing Sheets

U.S. PATENT DOCUMENTS

| | | | |
|---|---|---|---|
| 5,675,535 A | | 10/1997 | Jinbo |
| 5,850,359 A | * | 12/1998 | Liu .............................. 365/156 |
| 6,104,666 A | * | 8/2000 | Kumar .................. 365/230.06 |
| 2001/0024381 A1 | | 9/2001 | Fuchigami et al. |
| 2003/0026120 A1 | * | 2/2003 | Scheuerlein ............... 365/105 |
| 2003/0214861 A1 | * | 11/2003 | Takano et al. .............. 365/200 |

FOREIGN PATENT DOCUMENTS

EP            0399820        11/1990

OTHER PUBLICATIONS

Chun, Jino, et al., A 1.2 ns GaAs 4K Read Only Memory, IEEE, pp. 83-86, Nov. 1988.

* cited by examiner

SENSING CIRCUIT FOR A SEMICONDUCTOR MEMORY

PRIORITY CLAIM

This application claims priority from European patent application No. 03017939.4, filed Aug. 6, 2003, which is incorporated herein by reference.

TECHNICAL FIELD

The present invention generally relates to semiconductor memories, either stand-alone or embedded in more complex integrated circuit electronic systems. In particular, albeit not limitatively, the invention relates to non-volatile semiconductor memories such as for example ROMs, EPROMs, EEPROMs and Flash memories. More specifically, the invention relates to an improved sensing circuit for a semiconductor memory.

BACKGROUND

Conventional sensing circuits exploited in semiconductor memories, particularly non-volatile semiconductor memories having the so-called NOR memory matrix architecture, have the general structure depicted schematically in FIG. 5. The matrix bit line BL that includes a memory cell MC selected for reading is electrically connected to a first circuit branch 501, containing a load P-channel MOSFET P51 connected in a current-mirror configuration to a diode-connected P-channel MOSFET P52 in a second circuit branch 503; the second circuit branch 503 is run through by a reference current IREF, generated by a reference current generator 505.

In series to the load MOSFET P51, i.e., between the load MOSFET P51 and the bit line BL, a cascode-connected N-channel MOSFET N51 is provided, typically of the so-called natural or native type (in jargon, a low threshold voltage MOSFET, having a threshold voltage determined simply by the doping level of the doped semiconductor well within which the MOSFET is formed, without any threshold voltage adjustment dopant implant); the cascode-connected MOSFET N51 is inserted in a negative feedback network comprising an inverter 507 having input and output respectively connected to the source and to the gate of the MOSFET N51.

Typically, the reference current generator 505 is formed by a reference memory cell, structurally identical to the memory cell MC, set in a well-known state and connected to a respective reference bit line. For reasons of symmetry of the two circuit branches 501 and 503, a circuit arrangement including a cascode-connected MOSFET controlled by a feedback-connected inverter similar to that provided in the branch 501 is also provided in the reference circuit branch 503.

Circuit nodes corresponding to the drains of the MOSFETs P51 and P53 are connected to the inverting and non-inverting inputs of a differential amplifier 509, that amplifies a voltage difference between these two circuit nodes.

An equalization N-channel MOSFET N53 acting as a pass transistor (alternatively, a transfer gate) is provided for substantially short-circuiting the two circuit branches 501 and 503 at the drains of the MOSFETs P51 and P53, in a specific phase of a sensing operation.

A sensing operation is made up of two distinct phases: a bit line precharge phase and an evaluation phase.

In the precharge phase, the bit line BL is precharged to a predetermined potential; the equalization MOSFET N53 is turned on (equalization signal EQ asserted high), thereby the first circuit branch 501 is short-circuited to the second circuit branch 503; in this way, during the precharge phase, the potential at the drain of the MOSFET P51 is kept equal to that at the drain of the MOSFET P53.

During the precharge phase, the potential of the word line WL to which the memory cell MC belongs is also raised to a read word line potential, typically the supply voltage VDD of the integrated circuit, or a higher voltage generated by charge pumps.

At the end of the precharge phase, the equalization MOSFET N53 is turned off, and the potential at the drains of the MOSFETs P51 and P53 evolves dynamically; in particular, the evolution in time of the drain potential of the MOSFET P51 depends on the fact that memory cell MC sinks more or less current, and thus on the datum stored in the memory cell. The potentials of the drains of the MOSFETs P51 and P53 are compared to each other by the differential amplifier 509, which amplifies a slight potential difference to a full-swing logic signal. This phase of the sensing operation is the evaluation phase.

It can be appreciated that in the conventional sensing circuit described so far, the inputs of the differential amplifier 509 are connected to circuit nodes (the drains of the MOSFETs P51 and P53) that are decoupled from the relatively heavily loaded nodes corresponding to the respective bit lines (matrix bit line BL and reference bit line) by means of the cascode-connected MOSFETs.

The conventional sensing circuit described schematically in the foregoing is affected by some problems.

One of the problems of the conventional sensing circuit is that, depending of the electrical load offered by the bit line to the load MOSFET P51 and the cascode-connected MOSFET N51, more or less pronounced overshoots in the bit line potential may take place during the precharge. This has a detrimental effect on the sensing operation, because the cascode-connected MOSFET N51 is only capable of delivering current to the bit line, and is not instead capable of sinking current therefrom; thus, if the bit line potential exceeds the target voltage to be reached at the end of the precharge phase, there is nothing (exception made for possible small current leakages) that can (in a reasonably short time) bring the bit line potential back to the target value.

This problem is also encountered when the bit line starting potential before the start of the precharge phase is higher than the target potential. To this purpose, a bit line discharge circuit path is normally provided for, which is activated before the precharge phase so as to discharge the bit line to ground and ensure that the bit line potential starts from a value lower than the target value.

Another problem of the above described circuit is due to the fact that the presence of the cascode-connected MOSFET N51 in series to the bit line BL actually sets a lower limit to the reduction of the supply voltage VDD. In this respect, the use of a natural MOSFET, having a relatively low threshold voltage, is also disadvantageous, because in some technological processes natural MOSFETs are not as good as normal MOSFETs, which have a higher threshold voltage set through a dedicated threshold-voltage adjustment dopant implant.

Additionally, in the evaluation phase, the evaluation of the datum stored in the memory cell MC to be sensed is brought about by a circuit element (the differential amplifier) different from the circuit element (the cascode-connected MOSFET N51) that is used for precharging the bit line. This may introduce errors in the sensing operation, because the two circuit elements are normally affected by different offsets.

SUMMARY

In view of the state of the art outlined in the foregoing, an aspect of the present invention is to provide an improved sensing circuit which is not affected by the problems of the known circuits, in particular by the problems discussed above.

This and other objects have been attained by means of a sensing circuit according to one aspect of the present invention.

Summarizing, a sensing circuit according to one aspect of the present invention comprises a circuit branch intended to be electrically coupled to a memory bit line having connected thereto a memory cell to be sensed.

A bit line precharge circuit is provided, for precharging the memory bit line to a predetermined potential in a precharge phase of a memory cell sensing operation according to another aspect of the present invention.

According to another aspect of the present invention, an evaluation circuit is associated with the memory bit line for evaluating an electric quantity developing on the memory bit line during an evaluation phase of the memory cell sensing operation, said electric quantity being indicative of an information content of the memory cell.

The bit line precharge circuit is adapted to both charging and discharging the memory bit line according to a further aspect of the present invention, so that the predetermined bit line potential is reached irrespective of a memory bit line initial potential at the beginning of the precharge phase.

At least the bit line precharge circuit includes a precharge negative feedback control loop for controlling the memory bit line potential during the precharge phase according to a further aspect of the invention. A same circuit element may be provided that controls the memory bit line potential during the precharge phase and evaluates the electric quantity during the evaluation phase of the memory cell sensing operation.

In particular, a direct operative connection of the precharge circuit and of the evaluation circuit to the memory bit line may be provided; by direct operative connection there is intended a connection of the precharge circuit and of the evaluation circuit to the bit line without interposition of circuit element arrangements having the function of impedance decoupling means (such as the cascode-connected natural MOSFET in the conventional sensing circuit shown in FIG. 5) that decouple the precharge and the evaluation circuits from the bit line. The direct operative connection does not exclude instead that circuit elements not having such an impedance decoupling function be provided, such as for example the elements of the bit line selection circuits for selecting specified bit lines in a memory matrix.

BRIEF DESCRIPTION OF THE DRAWINGS

The features and advantages of the present invention will be made apparent by the following detailed description of some embodiments thereof, description that will be conducted making reference to the annexed drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
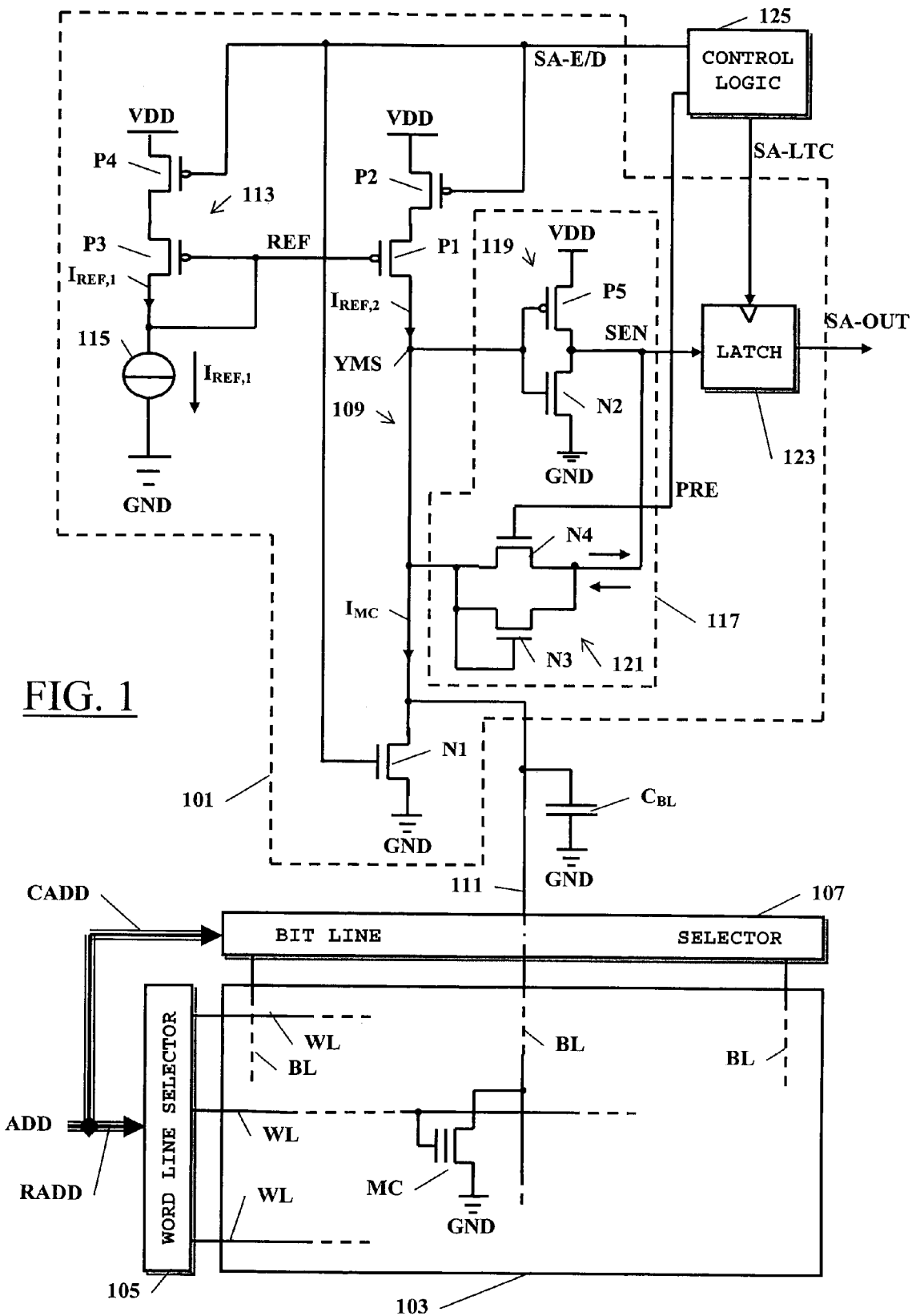
FIG. 1 is a partially schematic block and partially circuit diagram of a sensing circuit according to a first embodiment of the present invention.

With reference to the drawings, in FIG. 1 a sensing circuit according to a first embodiment of the present invention is shown; the sensing circuit is circumscribed by dashed lines and is globally identified by 101.

The sensing circuit 101 is adapted to sensing a semiconductor memory cell MC, particularly but not limitatively a non-volatile memory cell and, even more particularly, an electrically-alterable memory cell such as an EPROM cell, an EEPROM cell or a Flash memory cell.

The memory cell MC, for example of the type constituted by a floating-gate MOS transistor having externally-accessible drain, source and control gate electrodes and an electrically-isolated floating gate electrode into which electric charge, particularly electrons, can be selectively injected by means of mechanisms such as hot-electron injection or tunneling, is one of a plurality of identical memory cells, arranged by rows and columns so as to form a two-dimensional array or memory matrix 103 of a semiconductor memory, either stand-alone or embedded in a more complex integrated circuit, e.g., a microcontroller integrated circuit.

Word lines WL of memory cells MC are each one associated with a respective row of the matrix 103; similarly, bit lines BL of memory cells are each one associated with a respective column of the matrix 103. The generic memory cell in the memory matrix 103, e.g. the memory cell MC shown in the drawing, has the control gate connected to a respective word line WL and the drain connected to a respective bit line BL; the source of the memory cell MC is (at least as far as the sensing of the memory cell is concerned) connected to a line carrying a reference voltage (the ground) GND.

A word line selector 105 is provided for the selection of the matrix word lines WL. The word line selector 105 receives row address codes RADD through an address code distribution bus ADD of the semiconductor memory, decodes the row address codes RADD received and accordingly selects one of the word lines WL. The selected word line WL is brought to a prescribed voltage (read voltage when the semiconductor memory is accessed in reading) of, e.g., 5 V.

A bit line selector 107 is also provided for the selection of the matrix bit lines BL. The bit line selector 107 receives column address codes CADD through the address code distribution bus ADD of the semiconductor memory and decodes the column address codes CADD received. Depending on the column address code received, the bit line selector 107 selects one of the bit lines BL.

The bit line selector 107 allows electrically coupling the selected bit line BL to the sensing circuit 101. The remaining bit lines BL are not coupled to the sensing circuit and are left floating or, alternatively, they are kept to ground.

By means of the word line selector 105 and the bit line selector 107, a specific memory cell in the memory matrix 103, e.g., the memory cell MC, can be electrically coupled to the sensing circuit 101.

The sensing circuit 101 comprises a circuit branch 109 (memory cell or matrix circuit branch) adapted to be coupled to the selected bit line BL so as to be run through by a memory cell current $I_{MC}$. The circuit branch 109 comprises a load, in the shown example formed by a P-channel MOSFET P1, arranged so that a source thereof is connectable to a supply voltage distribution line VDD of the semiconductor memory, while a drain of the load MOSFET P1 is electrically connected to a bit line selector output line 111 that, in turn, is electrically coupled to the selected bit line BL by the bit line selector internal circuits.

The circuit branch 109 also includes sensing circuit enable/disable means, which, in the example herein described, comprise a P-channel MOSFET P2 connected between the source of the load MOSFET P1 and the supply voltage distribution line VDD, and an N-channel MOSFET N1 connected between the drain of the load MOSFET P1 and a ground voltage distribution line GND. The gates of the MOSFETs P2 and N1 are connected to a sensing circuit enable/disable signal SA-E/D. When the sensing circuit enable/disable signal SA-E/D is asserted to the low logic level ("0"), the MOSFET P2 is turned on and the MOSFET N1 is turned off, thereby an electric path is established between the supply voltage distribution line VDD and the memory cell MC that belongs to the selected bit line BL and the selected word line WL; in this condition, the sensing circuit 101 is enabled. When, on the contrary, the sensing circuit enable/disable signal SA-E/D is de-asserted to the high logic level ("1"), the MOSFET P2 is turned off and the MOSFET N1 is turned on; the load MOSFET P1 is thus disconnected from the supply voltage distribution line VDD, and the circuit branch 109 is kept to ground by the MOSFET N1; in this condition, the sensing circuit 101 is disabled.

It is observed that the sensing circuit enable/disable means may be realized in several alternative ways, and particularly the MOSFETs P2 and N1, acting as switches, can be replaced by any other suitable switch, such as pass gates.

The load MOSFET P1 receives, at the gate thereof, a bias signal REF, particularly a voltage bias signal, that causes the load MOSFET P1 to be biased in a proper working condition.

The bias signal REF is generated by a bias signal generator 113, which, in the exemplary embodiment herein described, comprises a circuit branch 113 including a diode-connected P-channel MOSFET P3, with the source connectable to the supply voltage distribution line VDD, and the drain (to which the gate is short-circuited) connected to a reference current generator 115 generating a reference current $I_{REF,1}$. A bias signal generator disable element, for example a P-channel MOSFET P4 controlled by the sensing circuit enable/disable signal SA-E/D, is series-connected between the supply voltage distribution line VDD and the source of the MOSFET P3.

The gate of the MOSFET P3 is connected to the gate of the load MOSFET P1; in this way, when enabled, the two circuit branches 109 and 113 form a so-called current mirror arrangement, thereby the reference current $I_{REF,1}$, generated by the current generator 115 and flowing through the MOSFET P3, is mirrored into the load MOSFET P1, which is caused to sustain the flow of a current $I_{REF,2}$ equal or, more generally, proportional (according to a proportionality factor depending on the aspect ratios of the two MOSFETs P1 and P3) to the reference current $I_{REF,1}$.

The current generator 115 can be realized employing reference memory cells, structurally identical to the memory cells MC and programmed in a specified status so as to sink a predetermined current.

The sensing circuit 101 comprises a circuit arrangement 117, electrically coupled to the memory cell circuit branch 109 and having the double function of pre-charging the selected bit line BL to a desired working potential, and of evaluating an electric quantity associated with the memory cell circuit branch 109 and indicative of the datum (in a two-levels memory cell, a "1" or "0") stored in the selected memory cell MC. In particular, the evaluation of such an electric quantity is performed by directly sensing a voltage of the selected bit line, particularly a voltage signal developing on the bit line as a consequence of a current sunk by the memory cell MC.

In the exemplary embodiment herein considered, the circuit arrangement 117 comprises a feedback network associated with the circuit branch 109. The feedback network comprises a buffer 119, more particularly an inverting buffer and, even more particularly albeit not limitatively, a CMOS inverter comprising a P-channel MOSFET P5 and an N-channel MOSFET N2 connected in series to each other and between the supply voltage distribution line VDD and the ground distribution line GND. The gates of the MOSFETs P5 and N2 are commonly connected to a node YMS of the circuit branch 109 that, from a circuit topological viewpoint, coincides with the drain of the load MOSFET P1; thus, the electric potential of the node YMS substantially coincides with the electric potential of the selected bit line BL. An output SEN of the inverter 119 is electrically coupled to the circuit branch 109 through a parallel arrangement of a unidirectional current-conducting element and a controlled open/closed-status switch. For example, the unidirectional current-conducting element comprises a diode and, more particularly, referring to the exemplary embodiment herein described, a diode-connected N-channel MOSFET N3 with source connected to the output SEN of the inverter 119 and short-circuited gate and drain connected to the circuit branch 109 at a point topologically corresponding to the node YMS. Still referring to the exemplary embodiment herein described, the controlled open/closed-status switch comprises an N-channel MOSFET N4, acting as a pass transistor, with source and drain connected to the circuit branch 109, at a point topologically corresponding to the node YMS, and to the output of the inverter 119, and gate controlled by a precharge-enable logic signal PRE.

It is pointed out that both the unidirectional current-conducting element and the controlled open/closed-status switch may be realized in several different ways. For example, both the unidirectional current-conducting element and the controlled open/closed-status switch might be realized by means of P-channel MOSFETs.

The output SEN of the inverter 119 is connected to a data input of a bistable element 123, such as a latch or a flip-flop. A latching or clocking input of the bistable element 123 is controlled by a latching signal SA-LTC, which is asserted (e.g., from the low to the high logic state) when a logic state present at the output SEN of the inverter 119 is to be loaded into the bistable element 123. A data output of the bistable element forms the output SA-OUT of the sensing circuit 101, and provides a digital signal whose logic state is indicative of the datum stored in the memory cell MC selected for reading.

The signals SA-E/D, PRE and SA-LTC are for example generated by a memory control logic 125, controlling the operation of the semiconductor memory.

Figure 2A:
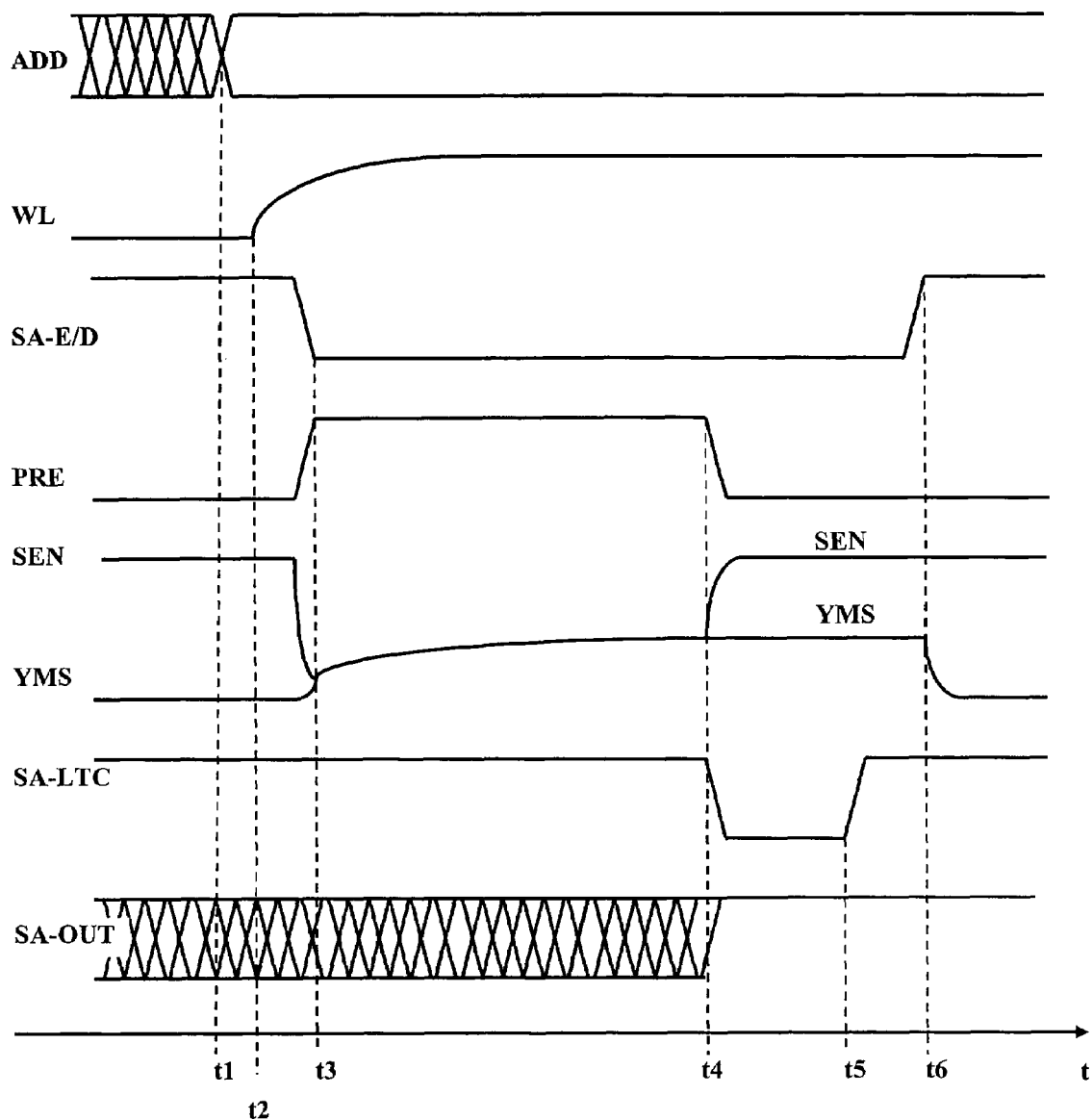
FIG. 2A is a diagram showing, in simplified way, the timing of the main signals involved in the sensing circuit of FIG. 1, during a sensing operation.

The operation of the sensing circuit 101 will be now explained making reference to the simplified timing diagram of FIG. 2A.

Let it be assumed that, at a generic time instant t1, an address code ADD is received by the semiconductor memory, and that the received address code identifies the memory cell MC shown in FIG. 1. The word line selector 105 decodes the row address code RADD and selects the word line WL to which the memory cell MC belongs; starting from a time instant t2, the word line potential rises towards the prescribed read potential, e.g. corresponding to the supply voltage of the memory, following an exponential curve due to the relatively high capacitance of the word line.

In parallel, the bit line selector 107 decodes the column address code CADD and selects the bit line BL to which the memory cell MC belongs, electrically connecting such a bit line BL to the sensing circuit 101.

At the time instant t3, the memory control logic 125 asserts the sensing circuit enable/disable signal SA-E/D (bringing it from the high to the low logic state); the sensing circuit 101 is thus enabled.

At this same time instant t3, the memory control logic 125 also asserts the pre-charge signal PRE (bringing it from the low to the high logic state). In this way, the pass transistor N4 is turned on, and the feedback loop implemented by the feedback network in the circuit arrangement 117 is thus closed.

It is observed that the simultaneous assertion of the two signals SA-E/D and PRE is merely exemplary and not at all limitative; these two signals may as well be asserted at different time instants.

The assertion of the signal PRE starts the bit line pre-charge phase. During this phase, a bit line overall capacitance $C_{BL}$ (made up of several lumped and distributed contributions, but shown in FIG. 1 as a lumped circuit element) is charged so that the potential of the selected bit line BL is brought to a desired working level. The current that is used for charging the bit line capacitance $C_{BL}$ (shortly, the bit line precharge current) is furnished both by the load MOSFET P1, which is run through by the mirror current $I_{REF_2}$ proportional to the reference current $I_{REF,1}$, and by the P-channel MOSFET P5 (the high-side driver) of the inverter 119. During the precharge phase, the bit line capacitance $C_{BL}$ is automatically charged up to a working potential such that the potential of the node YMS falls in a range for which the input-output characteristic of the inverter 119 is relatively steep, so that the small-signal gain of the inverter 119 is relatively high; in particular, the bit line capacitance $C_{BL}$ is charged up to a working potential such that the potential of the node YMS corresponds to the steepest region of the input-output characteristic, and thus to the region of highest small-signal gain, of the inverter 119.

After a predetermined time interval (e.g., 15 ns), sufficiently long for ensuring the full precharge of the bit line BL (and also ensuring that the word line potential has reached a steady-state value), at the time instant t4 the memory control logic 125 de-asserts the precharge signal PRE, thus terminating the precharge phase. The pass transistor N4 is turned off, and the feedback loop is thus opened (the diode-connected MOSFET N3 is off, unless the potential at the node YMS exceeds the output voltage of the inverter 119 by at least the threshold voltage of the MOSFET N3).

From now on, the bit line potential is left free to evolve dynamically. In particular, considering for simplicity and merely by way of example that the selected memory cell MC is programmed (meaning that the memory cell MC is in a high threshold voltage state, conventionally corresponding to a "0" stored state), the memory cell MC does not sink current (because the word line potential is not sufficient for turning the memory cell on); the potential of the bit line BL raises from the working potential reached during the precharge phase. On the contrary, if the selected memory cell MC is not programmed (meaning that the memory cell MC is in a low threshold voltage state, conventionally corresponding to a "1" stored state), the memory cell MC sinks a current, and the potential of the bit line BL falls from the working potential reached during the precharge phase.

Figure 2B:
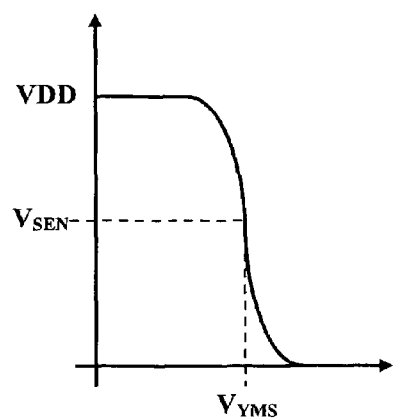
FIG. 2B schematically shows an input-output characteristic of an element of the sensing circuit of FIG. 1 acting both as a bit line precharge element and as a sensing element.

As schematically depicted in FIG. 2B, since the bit line working potential reached during the precharge phase corresponds to the steepest region of the input-output characteristic, and thus to the maximum small-signal gain, of the inverter 119, even a slight deviation of a few mV up or down from the working potential is sufficient to cause the inverter 119 to switch, so that the output SEN is brought to the supply voltage VDD or to the ground GND.

At the time instant t5, the latching signal SA-LTC, which had previously been brought from the high to the low logic level, is brought back to the high logic state; the rising edge of the latching signal SA-LTC causes the latch 123 to load the logic state present at the inverter output SEN. The read datum is now available at the data output of the bistable element 123, i.e., at the output OUT of the sensing circuit 101.

Finally, at the time instant t6 the sensing circuit enable/disable signal SA-E/D is de-asserted, and the sensing circuit 101 is thus disabled.

Figure 5:
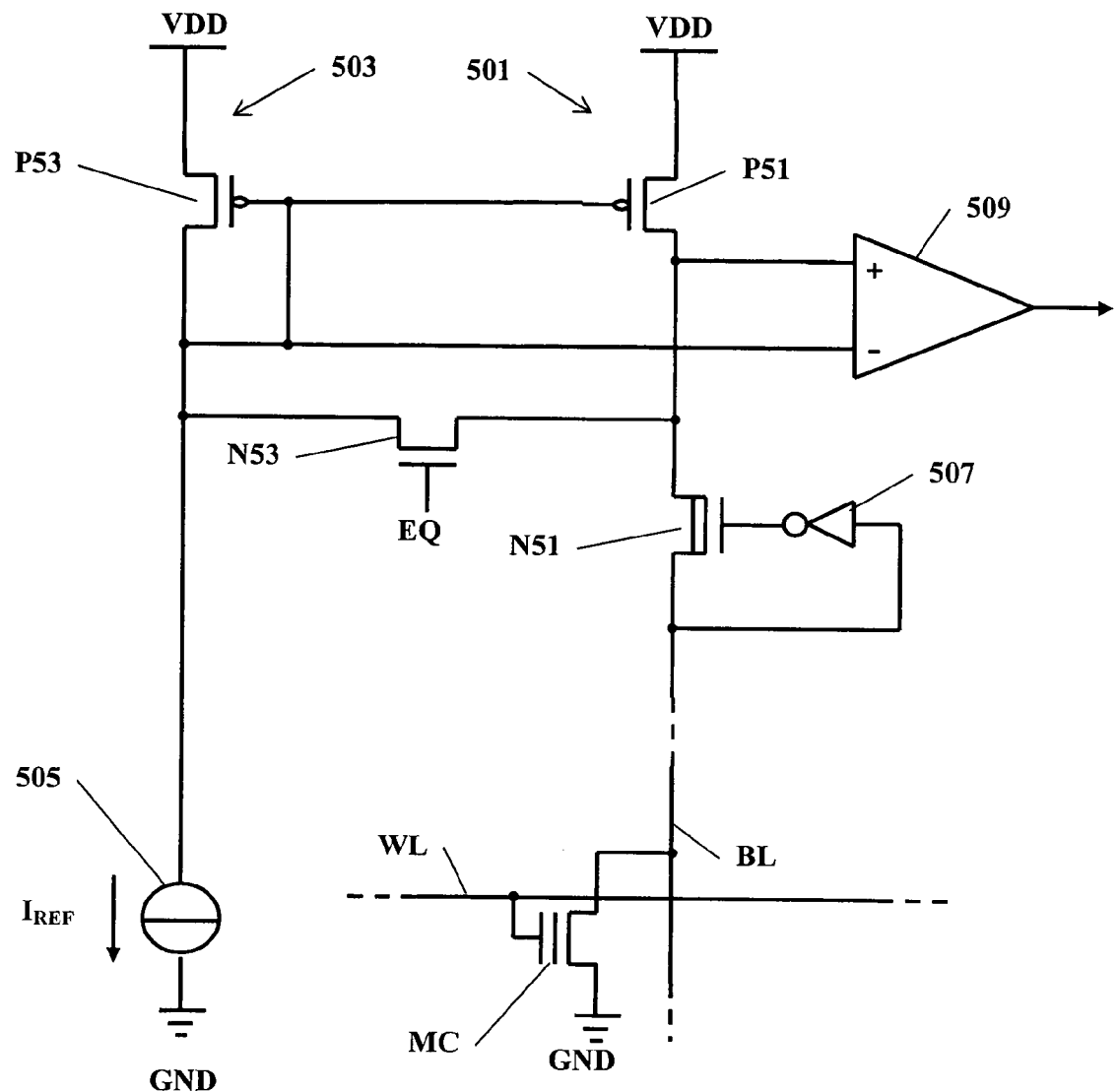
FIG. 5 is a simplified diagram of a sensing circuit according to the prior art.

It can be appreciated that, differently from the known sensing circuit depicted in FIG. 5, in the sensing circuit 101 the circuit node connected to the circuit arrangement that performs the evaluation substantially coincides with the bit line that contains the memory cell to be sensed, in the sense that no impedance decoupling is provided between the bit line and the evaluation circuit arrangement.

The sensing circuit 101 has a number of advantages over the conventional sensing circuits.

First of all, during the precharge phase any undesired overshoot of the bit line potential is avoided; in fact, if, during the precharge, the potential of the node YMS exceeds the desired working potential, the inverter 119 tends to render the P-channel MOSFET P5 slightly less conductive, and to render instead the N-channel MOSFET N2 slightly more conductive; through the pass transistor N4 and the MOSFET N2, the bit line capacitance $C_{BL}$ can thus be discharged to ground. During the precharge phase, the closed feedback loop makes the sensing circuit 101 a circuit having a dominant pole.

Thanks to this, the selected bit line BL can be properly biased to the prescribed potential even in the case the bit line capacitance $C_{BL}$ is already charged before starting the precharge phase.

Another advantage of the sensing circuit 101 is that it is capable of operating even at very low supply voltage levels, in particular as low as 1 V. This is achieved thanks to the elimination of the cascode-connected MOSFET present in the prior art sensing circuit, which necessarily introduced a voltage drop in series to the memory cell.

Additionally, all the MOSFETs in the sensing circuit can be normal MOSFETs, structurally similar to each other; there is no need to use low-threshold voltage natural MOSFETs.

A further advantage of the sensing circuit 101 is that the precharge of the selected bit line and the evaluation of the potential that, after the bit line precharge, develops on the memory cell circuit branch 109 are performed by a same element, namely the inverter 119. In this way, the sensing operation is not negatively affected by different offsets introduced by the element that performs the precharge and by the element that performs the evaluation, in case the two elements are distinct.

Preferably, the pass transistor N4 is realized relatively low conductive, so that at the end of the precharge phase the output SEN of the inverter 119 is already unbalanced on the right side (when sensing a non-programmed memory cell MC, the fraction of the bit line precharge current supplied by the inverter 119 causes a voltage drop across the MOSFET N4 that already rises the potential of the output SEN of the inverter 119).

The diode-connected N-channel MOSFET N3 (or any other unidirectional current-flow element used in substitution thereof) has the function of limiting the voltage of the node YMS, and thus the drain voltage of the selected memory cell during the evaluation phase. If the selected memory cell is programmed and does not sink current, the voltage of the node YMS raises, and causes the inverter 119 to switch: the output SEN of the inverter 119 is thus brought to the ground GND. As the voltage of the node YMS exceeds the ground voltage plus the threshold voltage of the MOSFET N3, the latter turns on and establish an electric path between the supply voltage VDD and the ground GND through the load MOSFET P1, the MOSFET N3 and the MOSFET N2 of the inverter 119.

In the foregoing, for the sake of simplicity of description, it has been assumed that the bit line selector 107 selects one of the bit lines BL at a time; actually, the bit line selector 107 more typically selects a packet of bit lines BL at a time, e.g. eight or sixteen bit lines, depending on the degree of parallelism of the semiconductor memory, i.e., on the width of the memory locations; each one of the selected bit lines is electrically coupled to a respective sensing circuit similar to the one shown in the drawing.

It is also observed that the bias signal generator that generates the bias signal REF for the load MOSFET P1 may be unique for all the different sensing circuits.

The sensing circuit described so far is particularly adapted to be used in semiconductor memories having memory matrices with relatively short bit lines, and thus with relatively small bit line capacitance; for example, the sensing circuit is adapted to memories in which the memory matrix is partitioned into several, relatively small memory blocks (e.g., memory sectors of a Flash memory), each block having associated therewith respective sensing circuits. In fact, the use of a simple inverter as both bit line precharge and memory cell evaluation circuit element allows keeping the number of components (particularly, the number of MOSFETs) quite low; the sensing circuit thus occupies a very small semiconductor area.

Figure 3:
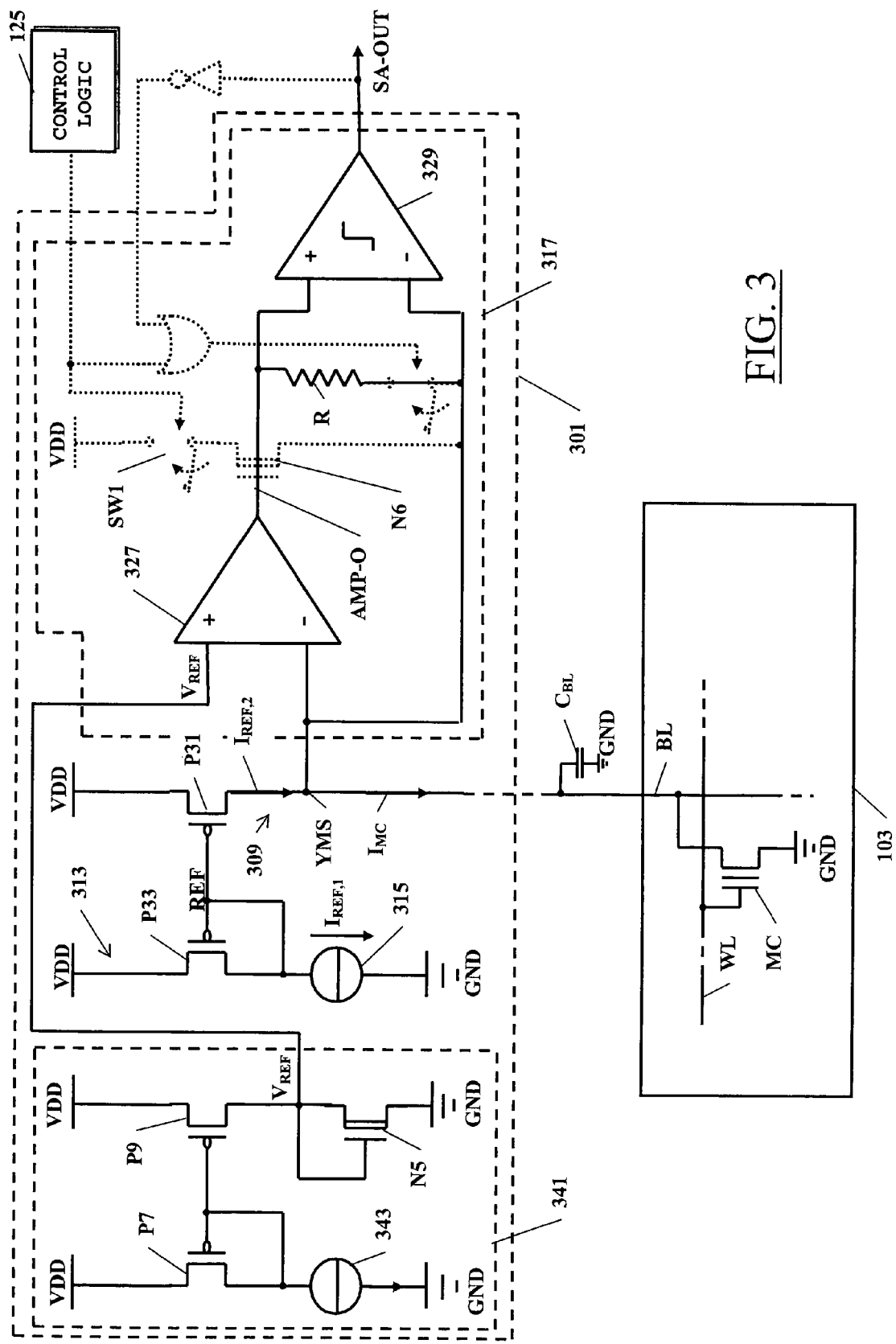
FIG. 3 is a partially schematic block and partially circuit diagram of a sensing circuit according to a second embodiment of the present invention.

A sensing circuit 301 according to another embodiment of the present invention is depicted in FIG. 3, and will be hereinbelow described.

Similarly to the sensing circuit 101 of FIG. 1, the sensing circuit 301 includes a circuit branch 309, or memory cell circuit branch, comprising a load P-channel MOSFET P31 and intended to be coupled to the selected bit line BL so as to be run through by a memory cell current $I_{MC}$.

Similarly to the sensing circuit 101 of FIG. 1, the load MOSFET P31 receives, at the gate thereof, a voltage bias signal REF, generated by a bias signal generator comprising a circuit branch 313 with a diode-connected P-channel MOSFET P33, connected to a reference current generator 315 generating the reference current $I_{REF,1}$ and having the gate connected to the gate of the load MOSFET P31, so as to form a current mirror, thereby the reference current $I_{REF,1}$ is mirrored into the load MOSFET P31, which is caused to sustain the flow of a current $I_{REF,2}$ proportional (e.g., equal) to the reference current $I_{REF,1}$.

Although not explicitly shown in the drawing for the sake of clarity, sensing circuit enable/disable means similar to those provided in the sensing circuit of FIG. 1 may be provided also in the sensing circuit of FIG. 3.

A circuit arrangement 317 is additionally provided, electrically coupled to the circuit branch 309 and having the double function of precharging the selected bit line BL to a desired working potential, and of evaluating an electric quantity associated with the circuit branch 309 and indicative of the datum stored in the selected memory cell MC, by performing a direct sensing of such a quantity on the selected bit line BL.

The circuit arrangement 317 comprises an amplifier 327, particularly a differential amplifier of relatively high gain, having an inverting input (indicated by the symbol "−") and a non-inverting input (indicated by the symbol "+"). The inverting input of the amplifier 327 is connected to the circuit node YMS that, as in the embodiment of FIG. 1, topologically coincides with the bit line BL. The non-inverting input is instead fed with a reference voltage $V_{REF}$, having a desired predetermined value (which is the value to which the potential of the node YMS is desired to be brought).

A load element R, particularly an element having an impedance containing a resistive component and, even more particularly, a resistor, is connected in negative feedback between an output AMP-O of the amplifier 327 and the inverting input thereof.

The output AMP-O of the amplifier 327 is also fed to a non-inverting input of a comparator 329, having an inverting input directly connected to the inverting input of the amplifier 327, and thus to the node YMS.

An output of the comparator 329 forms the output SA-OUT of the sensing circuit.

FIG. 3 also shows a circuit arrangement 341 for generating the reference voltage $V_{REF}$, according to an embodiment of the present invention. The reference voltage generator circuit 341 comprises a current mirror structure, with a first circuit branch including a diode-connected P-channel MOSFET P7 and, in series thereto, a current generator 343 sinking a prescribed current. The MOSFET P7 mirrors the current into a second branch, comprising a series connection of a P-channel MOSFET P9 and of a diode-connected N-channel MOSFET N5. The reference voltage $V_{REF}$ is the drain voltage of the MOSFET N5.

The sensing circuit 301 is particularly adapted to the use in the sensing of memory cells according to a peculiar sensing technique (in the following, briefly referred to as ramp-voltage sensing); the ramp-voltage sensing provides for applying a voltage ramp to the control gate of the memory cell to be read and to a reference memory cell, having a known threshold voltage, and for determining the datum contained in the memory cell on the basis of a time relationship between the instants at which the memory cell and the reference memory cell pass from one current conduction state (e.g., the non-conductive state) to another current conduction state (the conductive state). This sensing technique, devised in particular for the sensing of multi-level memory cells, i.e. memory cells whose threshold voltage can take any one of a plurality of more than two different values and that can thus be used for storing more than one bit each, is described in the European patent application No. 03425224.7, filed on 10 Apr. 2003 and in the name of the same Applicant, the content of which is incorporated herein by reference.

Merely by way of example, in the following the operation of the sensing circuit 301 will be explained making reference the ramp-voltage sensing technique, being intended that the sensing circuit 301 is not limited to the use in this peculiar sensing technique.

During the precharge phase of the selected bit line BL, the current necessary for bringing the bit line potential (and thus the potential of the node YMS) to the desired value (corresponding to the value of the reference voltage $V_{REF}$) is provided by the amplifier 327; in particular, in case the starting potential of the node YMS is lower than the target voltage, the amplifier delivers a current to the circuit branch 309 through the feedback resistor R, and the current delivered contributes to the charging of the bit line capacitance $C_{BL}$. In case the starting potential of the node YMS is higher than the target voltage, the amplifier 327 sinks current from the circuit branch 309 through the feedback resistor R, and thus discharges the capacitance $C_{BL}$.

In the ramp-voltage sensing, differently from conventional sensing methods such as the one referred to in the foregoing for describing the operation of the sensing circuit of FIG. 1, during the bit line precharge phase the selected word line WL, and thus the control gate of the selected memory cell MC, is kept to ground.

Thus, at the end of the precharge phase, the MOSFET P31 is run through by the current $I_{REF,2}$, and exactly this current is sunk by the amplifier 327, because, being the selected word line WL at ground, the selected memory cell MC does not sink any current $I_{MC}$, irrespective of the programming state thereof. In this condition, the sensing circuit 301 is active and operates in full regulation conditions.

The precharge phase lasts a time at least sufficient for precharging the bit line capacitance $C_{BL}$ to the target value. Then, the evaluation phase starts, and a ramp voltage of suitable slope is applied to the selected word line WL. As the word line voltage approaches the threshold voltage of the selected memory cell (which depends on the memory cell programming state), the memory cell MC starts sinking a progressively increasing current $I_{MC}$, which flows through the bit line BL. A progressively increasing fraction of the mirrored current $I_{REF,2}$ is now absorbed by the memory cell MC, while the feedback-connected amplifier 327, acting as a current-to-voltage converter, continues sinking the difference between the mirrored current $I_{REF,2}$ and the memory cell current $I_{MC}$. The feedback-connected amplifier 327 tends to keep the potential at the node YMS equal to the reference voltage $V_{REF}$ (the inverting input of the feedback-connected amplifier 327 acts in fact as a "virtual ground"; ideally, if the amplifier 327 has an infinite gain, the node YMS is kept exactly at the voltage of the non-inverting input of the amplifier 327, i.e. at the reference voltage $V_{REF}$). As long as the memory cell MC does not sink current, or the memory cell current IMC is less than the mirrored current $I_{REF,2}$, the current sunk by the amplifier 327 from the circuit branch 309 causes a voltage drop across the resistive element R, such that the inverting input of the comparator 329 has a potential higher than that of the non-inverting input, and the output SA-OUT is therefore low.

When the memory cell current $I_{MC}$ reaches the mirrored current $I_{REF,2}$, the current flowing through the resistive element R becomes zero, but nevertheless the closed-loop operating condition of the amplifier 327, and thus the regulation of the voltage at the circuit node YMS, is still guaranteed (the resistance of the resistive element R does not vary significantly with the voltage thereacross).

When the current $I_{MC}$ sunk by the memory cell MC exceeds the mirrored current $I_{REF,2}$, the amplifier 327 starts delivering the difference current, and the current delivered, flowing through the resistive element R, causes an opposite voltage drop thereacross, such that the comparator 329 switches the output SA-OUT high. The comparator 329 substantially transforms the analog signal across the resistive element R into a full-swing logic signal, of the order of the hundreds of mV; in this way, any possible offset introduced by the comparator 329 can be neglected.

In an embodiment of the present invention, an additional precharge path can be provided for, which is activated at the beginning of the precharge phase so as to speed up the precharge of the selected bit line BL. As shown in dotted lines in FIG. 3, the additional precharge path may for example include an N-channel MOSFET N6, preferably of the natural (low threshold voltage) type, controlled by the amplifier 327 and connected in series between the supply voltage VDD and the node YMS, with the interposition of a switch SW1, controlled for example by the control logic 125, so as to be put in the closed state at the beginning of the precharge.

In an embodiment of the present invention, a switch SW3 can be placed in series to the resistive element R, so as to open the feedback loop after the comparator 329 has switched, i.e., when the evaluation phase has been completed.

Figure 4:
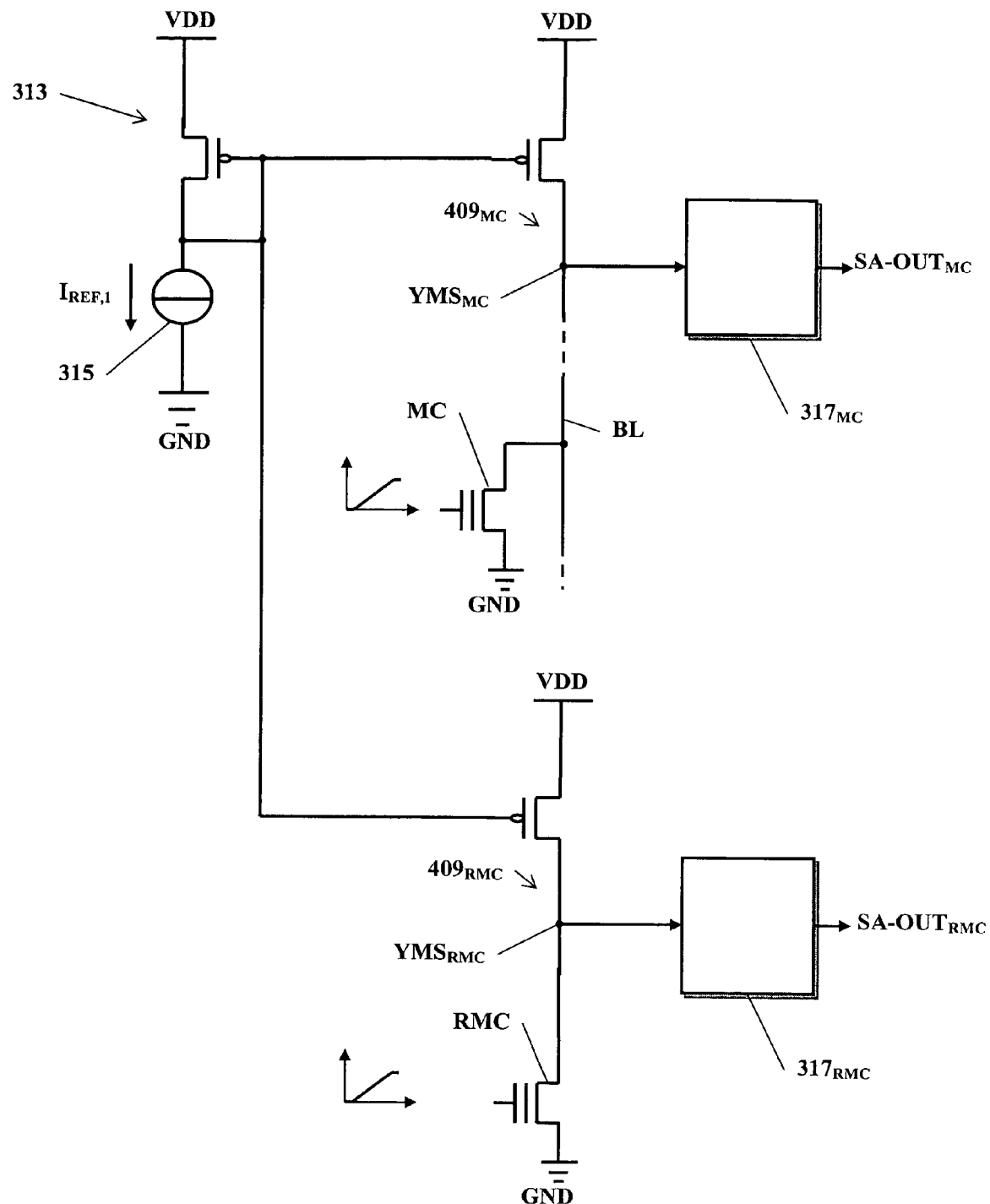
FIG. 4 is an extremely simplified diagram of a sensing arrangement, making use of sensing circuits according to the embodiment of the invention shown in FIG. 3, adapted to sensing a semiconductor memory cell in accordance to a so-called ramp sensing technique.

In FIG. 4 a sensing arrangement is schematically shown adapted to sensing a memory cell MC according to the above-mentioned ramp-voltage sensing method. For the sake of simplicity, it is assumed that the memory cell MC to be sensed is a two-levels memory cell, but this is not to be construed limitatively, because, as mentioned in the foregoing, the ramp-voltage sensing technique is particularly adapted to the sensing of multi-level memory cells. The memory cell MC to be sensed is part of a first circuit branch $409_{MC}$, identical or similar to the circuit branch 309 of FIG. 3; a circuit arrangement $317_{MC}$ corresponding to the circuit arrangement 317 of FIG. 3 is associated with the first circuit branch $409_{MC}$. A reference memory cell RMC, programmed in a predetermined status, is inserted in a second circuit branch $409_{RMC}$, identical or similar to the first circuit branch $409_{MC}$ and with which a circuit arrangement $317_{RMC}$ corresponding to the circuit arrangement 317 of FIG. 3 is associated. The two circuit branches $409_{RMC}$ and $409_{MC}$ are coupled in current-mirror configuration to the circuit branch 315, so as to mirror the reference current $I_{REF,1}$ into both of the circuit branches $409_{RMC}$ and $409_{MC}$.

After the precharge phase, substantially identical control gate voltage ramps are applied to the control gates of the memory cell MC and of the reference memory cell RMC.

The reference memory cell RMC is programmed in a predetermined state, intermediate to a non-programmed state and a programmed state of the memory cell MC. The programming state of the memory cell MC is established on the basis of the time relationship between the instant at which the outputs SA-OUT$_{MC}$ and SA-OUT$_{RMC}$ switch from the low to the high state: if the output SA-OUT$_{MC}$ switches high before the output SA-OUT$_{RMC}$, the memory cell MC is declared to be non-programmed (the threshold voltage of the memory cell MC is lower than that of the reference memory cell RMC), and the datum stored is conventionally assumed to be a "1"; if the output SA-OUT$_{MC}$ switches high after the output SA-OUT$_{RMC}$, the memory cell MC is declared to be programmed (the threshold voltage of the memory cell MC is higher than that of the reference memory cell RMC), and the datum stored is conventionally assumed to be a "0".

The sensing of a multi-level memory cell exploiting the ramp-voltage sensing technique is carried in a totally similar way, providing a higher number of reference memory cell circuit branches (e.g., three in the case the memory cell MC is a four-levels memory), with reference memory cells programmed in states intermediate to the different programming states of the multi-level memory cells.

It can be appreciated that in the sensing circuit of FIG. 3 the feedback-connection of the amplifier 327 is permanently present both in the precharge and in the evaluation phases, i.e., during the sensing operation, the amplifier 327 always operates in closed-loop conditions, and there are no time intervals or even single instants in which the amplifier 327 operates in open loop. The circuit nodes involved in the sensing operation are never left uncontrolled, and this ensures the absence of regions of uncertainty in the operation of the sensing circuit. In particular, the circuit node YMS is always inserted in a feedback loop that tends to keep the node voltage at a predetermined value ($V_{REF}$); after having been precharged, the potential of the selected bit line does not vary during the evaluation phase of the sensing operation.

The target bit line precharge potential can be rendered precise and stable, independent from the operating conditions such as temperature and supply voltage; the precision and stability of the target bit line precharge potential depends on the precision and stability of the reference voltage $V_{REF}$. To this purpose, depending on contingent needs, the designer can choose to implement a centralized reference voltage generator arrangement 341, unique for all the sensing circuits of the whole memory, or to provide localized reference voltage generator arrangements 341, one for each sensing circuit or for groups of sensing circuits.

The sensing circuit 301 is capable of precharging the bit line to the prescribed value $V_{REF}$ irrespective of the bit line starting potential: the feedback-connected amplifier 327 is in fact capable of both sinking and delivering current from/to the bit line. Overshoots in the bit line voltage are also prevented, even in a condition in which the selected memory cell does not sink current.

Thanks to the fact that the amplifier 327 is always inserted in a feedback loop, and behaves as a current-driven current-to-voltage converter, during the evaluation phase the response time of the sense amplifier 327 from the condition $I_{REF,2}=I_C$ to the switch instant of the comparator output SA-OUT is quite short, even a half of that of the known sensing circuits.

As in the embodiment of FIG. 1, thanks to the fact that the sensing is directly performed on the selected bit line (without any impedance decoupling), the sensing circuit can operate at very low supply voltages, down to approximately 1 V, without the necessity of using current mirrors with low threshold voltage MOSFETs.

Additionally, as in the embodiment of FIG. 1, also in this case a same circuit arrangement is exploited both for precharging the selected bit line and for evaluating the electric quantity (in this case, the current) indicative of the memory cell status; thanks to this, any offset is automatically eliminated.

Finally, the integration of the sensing circuit requires a relatively small semiconductor area, and is therefore suitable for highly-partitioned semiconductor memories.

As mentioned in the foregoing, the sensing circuit of FIG. 3 is particularly adapted to the use in the context of a ramp-voltage sensing technique of multi-level memory cells, in which the sensing circuit must be able to detect, with the maximum possible precision, in a continuous way and with the minimum delay, that the memory cell current approaches, reaches and exceeds the reference current.

However, it is pointed out that the sensing circuit 301 can as well be exploited in different sensing contexts.

For example, the sensing circuit of FIG. 3 can be straightforwardly exploited for the sensing of two-levels memory cells according to the conventional sensing technique (to which reference was made in explaining the operation of the sensing circuit of FIG. 1).

The sensing circuit can also be exploited for the sensing of multi-level memory cells in a serial sensing context, particularly but not limitatively a serial dichotomic sensing; in this case, assuming for example that four-levels memory cells are to be sensed, three different reference current generators are used, and the memory cell is sensed by sequentially (serially) comparing the memory cell current to one or more of the three different reference currents.

The sensing circuits 101, 301, can be used in a variety of different types of circuits, such as semiconductor memories like FLASH memories. Moreover, an integrated circuit including the sensing circuits 101, 301 may be used in a variety of different types of electronic systems, such as a computer system.

Although the present invention has been herein disclosed and described by way of some embodiments, it is apparent to those skilled in the art that several modifications to the described embodiments, as well as other embodiments of the present invention are possible without departing from the scope thereof, as defined in the appended claims.

The invention claimed is:

1. A sensing circuit for a semiconductor memory, comprising:
   a circuit branch intended to be electrically coupled to a memory bit line, said memory bit line having connected thereto a memory cell to be sensed;
   a bit line precharge circuit, for precharging the memory bit line coupled to the circuit branch to a predetermined bit line potential in a precharge phase of a memory cell sensing operation, and
   an evaluation circuit for evaluating an electric quantity developing on the memory bit line during an evaluation phase of the memory cell sensing operation, said electric quantity being indicative of an information content of the memory cell,
   wherein the bit line precharge circuit is adapted to both charging and discharging the memory bit line, depending on a difference between a memory bit line potential and the predetermined bit line potential;

at least said bit line precharge circuit includes a precharge negative feedback control loop, for controlling the memory bit line potential during the precharge phase, and a same circuit element is provided that controls the memory bit line potential during the precharge phase and evaluates the electric quantity during the evaluation phase of the memory cell sensing operation.

2. The sensing circuit according to claim 1, comprising a direct operative connection of the precharge circuit and of the evaluation circuit to the memory bit line.

3. The sensing circuit according to claim 2, in which said precharge negative feedback control loop comprises circuit means controllable for selectively opening/closing the loop.

4. The sensing circuit according to claim 3, in which said circuit means comprises a switch.

5. The sensing circuit according to claim 4, in which the precharge negative feedback control loop comprises a buffer having an input directly connected to the memory bit line, and a current delivering/sinking output connected to the memory bit line through said switch.

6. The sensing circuit according to claim 5, in which said buffer is an inverting buffer including an inverter, particularly a CMOS inverter.

7. The sensing circuit according to claim 6, further comprising a bistable element fed by an output of the inverter and adapted to latch a logic state present at said output.

8. The sensing circuit according to claim 1, in which said evaluation circuit additionally includes an evaluation negative feedback control loop, for controlling the memory bit line potential during the evaluation phase of the memory sensing operation.

9. The sensing circuit according to claim 8, in which said precharge negative feedback control loop and said evaluation negative feedback control loop coincide.

10. The sensing circuit according to claim 9, in which said circuit element comprises a differential amplifier having an inverting input connected to the memory bit line, a non-inverting input fed by a reference voltage, and a feedback circuit element having an impedance, connected between an output of the differential amplifier and the inverting input thereof.

11. The sensing circuit according to claim 10, in which said reference voltage has a value corresponding to a target precharge value for the memory bit line potential.

12. The sensing circuit according to claim 11, further comprising a voltage comparator having a first and a second inputs connected to the two terminals of the feedback circuit element, for transforming a voltage developing across the feedback circuit element into a full logic signal.

13. Use of the sensing circuit according to claim 7 in a memory cell sensing method comprising:

applying to a memory cell to be sensed and to at least one reference memory cell a time-variable bias, said time-variable bias being adapted to cause a change in the current-conduction properties of the memory cell to be sensed and of the reference memory cell; and determining an information content of the memory cell to be sensed on the basis of a time relationship between the time instants at which the memory cell to be sensed and the reference memory cell change their current-conduction properties as a consequence of the time-variable bias.

14. A semiconductor memory comprising at least one memory cell and a sensing circuit for reading an information content of the memory cell, wherein the sensing circuit is realized according to claim 1.

15. A sensing circuit, comprising:

an output node;

an input node configured to be directly coupled to a memory bit line, with a memory cell to be sensed being coupled to the bit line;

a plurality of electronic components, the components being operable in a precharge mode to precharge the bit line to a precharge voltage and the same components that are operable to precharge the bit line also being operable in a sensing mode to sense a voltage on the bit line and generate an output voltage on the output node indicating a logic state of data stored in the memory cell; and wherein the plurality of components include a feedback circuit coupled between a sense node and the input node, the feedback circuit operable during the precharge mode to precharge the bit line to the precharge voltage and being operable during the sensing mode to sense the voltage on the bit line and generate the output voltage on the output node indicating the logic state of data stored in the memory cell.

16. The sensing circuit of claim 15 further comprising:

a current mirror including a load transistor having a first signal node coupled to the input node and a second signal node adapted to receive a supply voltage, the current mirror operable to supply a reference current through the load transistor to the bit line.

17. A sensing circuit, comprising:

an output node;

an input node adapted to be directly coupled to a memory bit line, with a memory cell to be sensed being coupled to the bit line;

a plurality of electronic components, the components being operable in a precharge mode to precharge the bit line to a precharge voltage and the same components that are operable to precharge the bit line also being operable in a sensing mode to sense a voltage on the bit line and generate an output voltage on the output node indicating a logic state of data stored in the memory cell; and wherein the plurality of electronic components comprise:

an inverter coupled between a sense node and the input node; and a switching circuit adapted to receive a precharge signal and coupled between the sense and input nodes, the switching circuit operable in the precharge mode responsive to the precharge signal being active to couple the sense node to the input node to develop a bias voltage on the input node and operable in the sensing mode to limit a voltage develop on the input node.

18. The sensing circuit of claim 17, wherein the inverter comprises, a PMOS transistor having a source node adapted to receive a supply voltage and a drain node coupled to the sense node, and having a gate node coupled to the input node; and an NMOS transistor having a source node adapted to receive a reference voltage and a drain node coupled to the sense node, and having a gate node coupled to the input node; and wherein the switching circuit comprises,
an NMOS transistor having a drain node coupled to the sense node and a source node coupled to the input node, and a gate node adapted to receive the precharge signal; and
a diode-coupled NMOS transistor having drain and gate nodes coupled to the input node a source node coupled to the sense node.

19. A sensing circuit, comprising:
an output node;
an input node adapted to be directly coupled to a memory bit line, with a memory cell to be sensed being coupled to the bit line;
a plurality of electronic components, the components being operable in a precharge mode to precharge the bit line to a precharge voltage and the same components that are operable to precharge the bit line also being operable in a sensing mode to sense a voltage on the bit line and generate an output voltage on the output node indicating a logic state of data stored in the memory cell; and
wherein the plurality of electronic components comprise:
a differential amplifier having a first input adapted to receive a reference voltage and a second input coupled to the input node, and having an output;
a resistive feedback element coupled between the output of the differential amplifier and the input node; and
a comparator having a first input coupled to the output of the differential amplifier and a second input coupled to the input node, and having an output.

20. The sensing circuit of claim 19 further comprising:
a first current mirror circuit operable to develop the reference voltage applied to the first input of the differential amplifier; and
a second current mirror including a load transistor having a first signal node coupled to the input node and a second signal node adapted to receive a supply voltage, the current mirror operable to supply a reference current through the load transistor to the bit line.

21. The sensing circuit of claim 19 wherein the resistive feedback element comprises a resistor.

22. An integrated circuit, comprising:
electronic circuitry coupled to a sensing circuit, including,
an output node;
an input node adapted to be directly coupled to a memory bit line, with a memory cell to be sensed being coupled to the bit line;
a plurality of electronic components, the components being operable in a precharge mode to precharge the bit line to a precharge voltage and the same components that are operable to precharge the bit line also being operable in a sensing mode to sense a voltage on the bit line and generate an output voltage on the output node indicating a logic state of data stored in the memory cell; and
wherein the plurality of components include a feedback circuit coupled between a sense node and the input node, the feedback circuit operable during the precharge mode to precharge the bit line to the precharge voltage and operable during the sensing mode to sense the voltage on the bit line and generate the output voltage on the output node indicating the logic state of data stored in the memory cell.

23. The integrated circuit of claim 22 wherein the electronic circuitry comprises non-volatile memory circuitry.

24. The integrated circuit of claim 23 wherein the non-volatile memory circuitry comprises FLASH memory circuitry.

25. An electronic system, comprising:
a plurality of electronic components, each electronic component including an integrated circuit containing electronic circuitry, with the electronic circuitry of at least one electronic component including a sensing circuit that includes,
an output node;
an input node adapted to be directly coupled to a memory bit line, with a memory cell to be sensed being coupled to the bit line; and
a plurality of electronic components, the components being operable in a precharge mode to precharge the bit line to a precharge voltage and the same components that are operable to precharge the bit line also being operable in a sensing mode to sense a voltage on the bit line and generate an output voltage on the output node indicating a logic state of data stored in the memory cell;
wherein the plurality of components include a feedback circuit coupled between a sense node and the input node, the feedback circuit operable during the precharge mode to precharge the bit line to the precharge voltage and operable during the sensing mode to sense the voltage on the bit line and generate the output voltage on the output node indicating the logic state of data stored in the memory cell.

26. The electronic system of claim 25 wherein the plurality of electronic components form a computer system and wherein at least one of the integrated circuits comprises a non-volatile memory.

27. A method of sensing a logic state of data stored in a non-volatile memory cell using a sensing circuit having an input node, comprising:
directly coupling the input node of the sensing circuit to a bit line;
coupling a non-volatile memory cell to be sensed to the bit line;
sensing the logic state of data stored in the non-volatile memory cell from a voltage on the bit line;
providing the sensed logic state on a sense node; and
providing feedback between the sense node and the input node through a parallel coupled open/close switch and a unidirectional current conducting element.

28. The method of claim 27 further comprising precharging the bit line to a precharge voltage prior to coupling the memory cell to the bit line.

29. A method of sensing a logic state of data stored in a memory cell using an inverter having an input adapted to be coupled to a bit line and an output, the method comprising:
supplying feedback from the output of the inverter to the input to precharge the bit line to a precharge voltage and bias the inverter in a high gain portion of a transfer curve associated with the inverter;
terminating the feedback from the output to input of the inverter; and
sensing a logic state of data stored in a memory cell coupled to the bit line from the output of the inverter.

30. The method of claim 29 wherein supplying feedback comprises activating a transistor coupled between the input and output of the inverter.

* * * * *